United States Patent [19]

Hsue et al.

[11] Patent Number: 5,559,352
[45] Date of Patent: Sep. 24, 1996

[54] ESD PROTECTION IMPROVEMENT

[75] Inventors: Chen-Chiu Hsue, Hsin-chu; Joe Ko, Hsinchu, Taiwan

[73] Assignee: United Microelectronics Corporation, Hsinchu, Taiwan

[21] Appl. No.: 354,373

[22] Filed: Dec. 12, 1994

Related U.S. Application Data

[62] Division of Ser. No. 139,858, Oct. 22, 1993, Pat. No. 5,374,565.

[51] Int. Cl.$^6$ ................................... H01L 29/76
[52] U.S. Cl. ................ 257/328; 257/173; 257/174; 257/355; 257/344; 257/408; 257/546
[58] Field of Search ....................... 257/173, 174, 257/328, 344, 355, 408, 546

[56] References Cited

U.S. PATENT DOCUMENTS

| | | | |
|---|---|---|---|
| 5,077,590 | 12/1991 | Fujihira | 357/23.13 |
| 5,130,760 | 7/1992 | Matzen et al. | 357/13 |
| 5,142,345 | 8/1992 | Miyata | 357/23.13 |
| 5,493,142 | 2/1996 | Randazzo et al. | 257/408 |

*Primary Examiner*—Edward Wojciechowicz
*Attorney, Agent, or Firm*—William H. Wright

[57] ABSTRACT

A method of forming an ESD protection device with reduced breakdown voltage, simultaneously with an integrated circuit which includes FET devices, and the resultant device structure, are described. A silicon substrate is provided on which there are field oxide regions, gates, and active regions. A first ion implant of a conductivity-imparting dopant is performed in a vertical direction into the active regions of the ESD protection device and the FET devices. A first insulating layer is formed over the ESD protection device and the FET devices, and over the field oxide regions. The first insulating layer is patterned to create spacers adjacent to the gates of both the ESD protection device and the FET devices. A second ion implant of a conductivity-imparting dopant with higher concentration than dopant from the first ion implant is performed into active regions of both the ESD protection device and the FET devices. A second insulating layer is formed over the ESD protection device and the FET devices, and over the field oxide regions. The second insulating layer is patterned to form contact openings to the active regions. Finally, a third ion implant of a conductivity-imparting dopant, with opposite conductivity from the first and second ion implants, having equal concentration to dopant from the first ion implant, is performed through the contact openings into active regions of the ESD protection device.

8 Claims, 5 Drawing Sheets

ESD PROTECTION IMPROVEMENT

This application is a divisional of Ser. No. 08/139,858 filed Oct. 22, 1993, and now U.S. Pat. No. 5,374,565.

RELATED PATENT APPLICATION

1) "Method of Improvement for LDD Process", inventor C. C.

Hsue, Ser. No. 08/131,373, filed Oct. 4, 1993 now U.S. Pat. No. 5,416,036 issued May 16, 1995.

BACKGROUND OF THE INVENTION

(1) Field of the Invention

The invention relates to the manufacture of highly dense integrated circuits, and more particularly to input protection devices to protect attached integrated circuits from damage due to electrostatic discharge.

(2) Description of the Related Art

During handling and operation of integrated circuit devices using Field Effect Transistor (FET) technology, large electrostatic charges can be transferred from external contacts of the integrated circuit into the interior of the circuit, causing damage and/or destruction to FET devices within. In order to prevent such damage, workers in the field have added input protection devices which are typically located between the external contacts and the FET devices. These protection devices are designed to provide a path to safely discharge the electrostatic charge and prevent damage to the internal FET devices.

One such device is shown in U.S. Pat. No. 5,142,345 by Miyata. In this invention, an input protection device is formed and later connected to an internal FET device and a memory structure, which it is designed to protect from electrostatic discharge (ESD). The input protection device is itself an FET device. The protection device's source/drain regions are formed with a single heavy ion implant during separate processing steps from the formation of the source/drain regions for the connected internal devices. Spacers are formed on the gates of both the internal and the protection devices, since the internal devices are formed using LDD (lightly doped drain) regions that require the spacers for one ion implant step.

Another such device is shown in U.S. Pat. 5,077,590 by Fujihira, and consists of a high voltage semiconductor device with an integrated Zener diode.

SUMMARY OF THE INVENTION it is a principal object of this invention to provide a method for forming an ESD protection device with a reduced junction breakdown voltage which improves the ESD characteristics of the protection device.

This object is achieved by forming an ESD protection device with reduced junction breakdown voltage, simultaneously with an integrated circuit which includes FET devices, on a silicon substrate on which there are field oxide regions, gates, and active regions. A first ion implant of a conductivity-imparting dopant is performed in a vertical direction into the active regions of the ESD protection device and the FET devices. A first insulating layer is formed over the ESD protection device and the FET devices, and over the field oxide regions. The first insulating layer is patterned to create spacers adjacent to the gates of both the ESD protection device and the FET devices. A second ion implant of a conductivity-imparting dopant with higher concentration than dopant from the first ion implant is performed into active regions of both the ESD protection device and the FET devices. A second insulating layer is formed over the ESD protection device and the FET devices, and over the field oxide regions. The second insulating layer is patterned to form contact openings to the active regions. Finally, a third ion implant of a conductivity-imparting dopant, with opposite conductivity from the first and second ion implants, having equal concentration to dopant from the first ion implant, is performed through the contact openings into active regions of the ESD protection device.

It is a further object of this invention to provide a structure of an ESD protection device with a reduced junction breakdown voltage which improves the ESD characteristics of the protection device.

This object is achieved by providing field oxide regions that are located in and on a silicon substrate, for isolation of the ESD protection devices and the FET devices. Gates with adjacent spacers for the ESD protection device are formed between the field oxide regions. Source/drain regions for the ESD protection device are located between the gate and the field oxide regions, and have a first lightly implanted region under the spacers, a heavier implanted region of same conductivity as the light ion implant between the first lightly implanted region and the field oxide regions, and a second lightly implanted region of opposite conductivity centered under the heavier implanted region.

DESCRIPTION OF THE PREFERRED EMBODIMENTS

Figure 1:
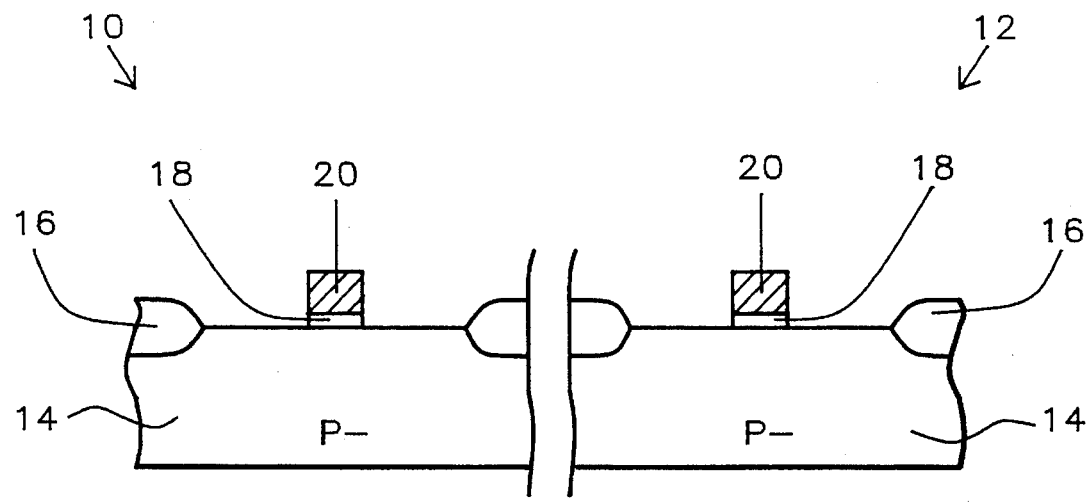
FIGS. 1 to 7 are cross-sectional views of the method, and resultant structure, of the invention for forming an ESD protection device to protect an attached integrated circuit from damage due to electrostatic discharge.

Referring now to FIG. 1, there is shown an ESD protection device 10 and an internal FET device 12. Both devices are formed at the same time on a single P– substrate 14. Field oxide regions 16 are formed in a conventional manner, for example, by the LOCOS (LOCal Oxidation of Silicon) technique, and serve to isolate devices from one another. A gate oxide layer is formed by thermal growth of the silicon substrate, as is well known in the art, to a thickness of between about 70 and 350 Angstroms. A gate layer is then deposited conformally, to a thickness of between about 1500 and 4500 Angstroms, and is typically a polysilicon or polycide. The gate layer is then patterned by conventional lithography and etching, to form a gate electrode for each device consisting of gate oxide 18 and gate 20.

Figure 2:
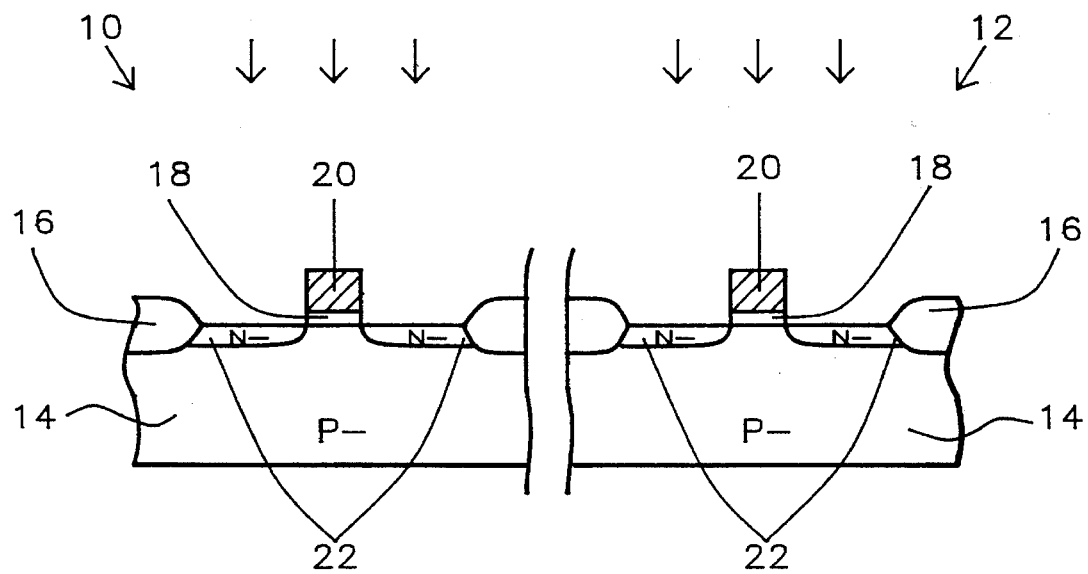

With reference to FIG. 2, a first ion implant is performed using phosphorus P31 at a concentration of between about 1 E 13 and 1 E 14 atoms/cm.$^2$. This forms N– regions 22, in the source and drain regions of the protection device 10 and internal FET device 12, with the N– regions being self-aligned due to the use of the gate as a mask.

Figure 3:
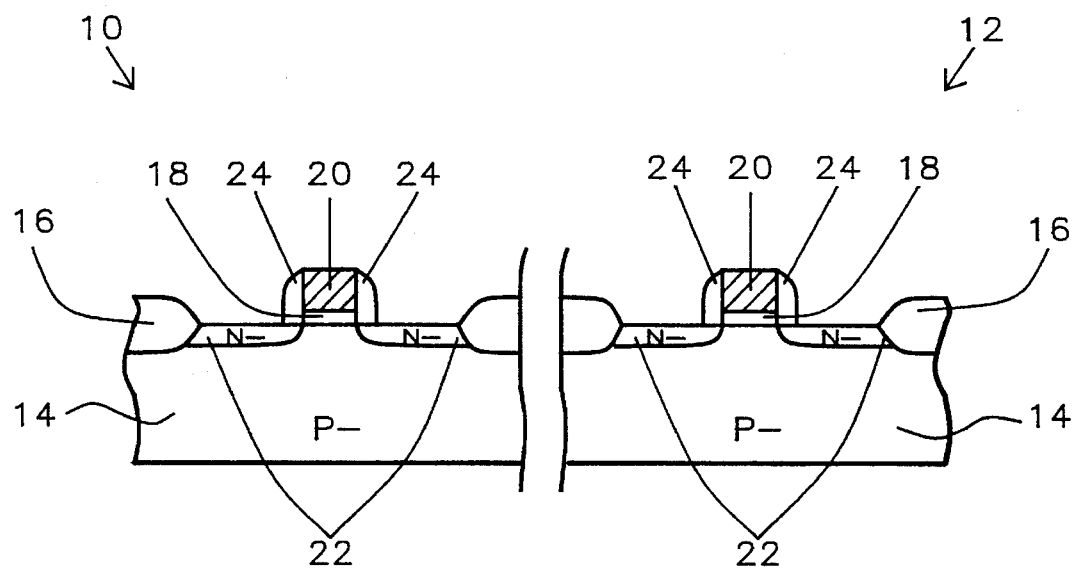

Referring now to FIG. 3, a conformal insulating layer of, for instance, silicon oxide, is deposited over the entire work surface by chemical vapor deposition (CVD) to a thickness of between about 1000 and 3000 Angstroms. This layer can also be a nitride or polysilicon. The layer is then patterned by an anisotropic reactive ion etch to form spacers 24 on the sides of the device gates, as is well known in the art.

Figure 4:
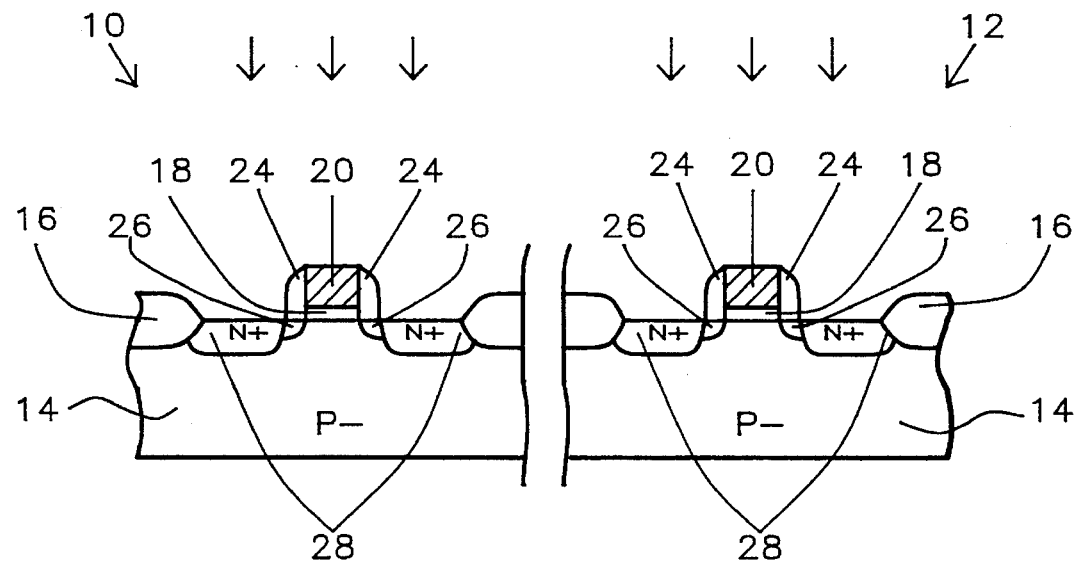

As shown in FIG. 4, a heavy ion implant is now performed, using arsenic AS75 at a dosage of between about 1 E 15 and 6 E 15 atoms/cm$^2$. A drive-in step is then performed by heating to a temperature of between about 750 and 950° C. for between about 10 and 60 minutes. Due to the drive-in, the resultant source/drain regions have a lightly doped drain (LDD) structure, as shown in FIG. 4 and as is well known in the art, with N− regions 26 under spacers 24, and N+ regions 28.

Figure 5:
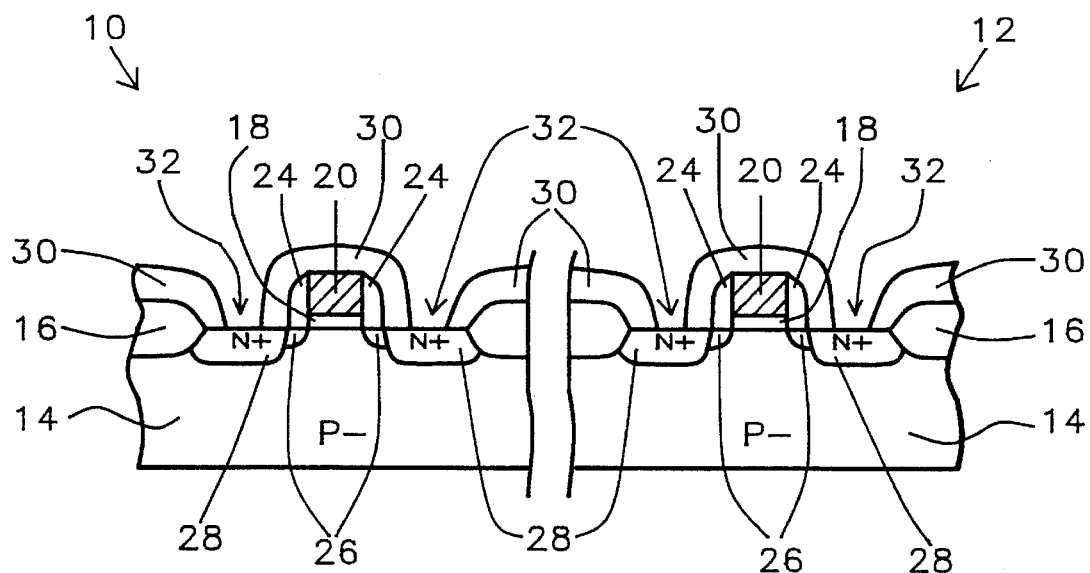

Referring now to FIG. 5, an insulating layer 30 is formed over the entire structure by depositing borophosphosilicate glass (BPSG) to a thickness of between about 3000 and 10,000 Angstroms. This layer is then reflowed to make it more planar by heating the structure to a temperature of between about 750° and 1000° C. for between about 10 and 60 minutes. The BPSG layer 30 is then patterned by conventional lithography and etching to form contact openings 32. Layer 30 could alternately be formed of phosphosilicate glass (PSG).

Figure 6:
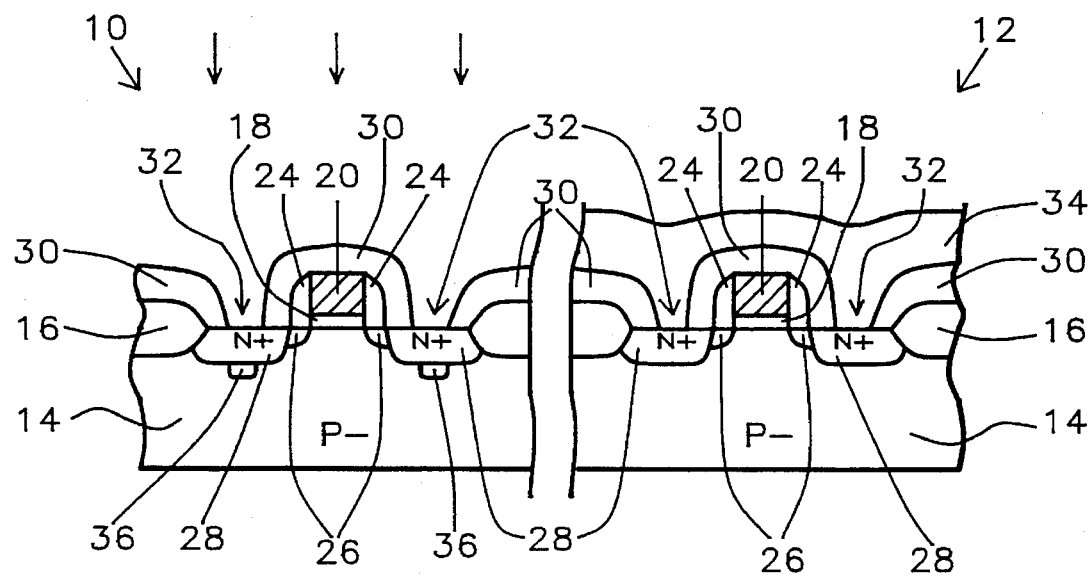

With reference to FIG. 6, the critical step of the invention is now performed. A photoresist 34 is formed and patterned with conventional lithography and development as is well known in the art to mask the internal device 12. A light ion implant is then performed through contact openings 32 into the active regions of the ESD protection device 10. This implant is of an opposite conductivity (P−) to that of the existing source/drain region 28. The implant is performed with boron B11 at a concentration of between about 2 E 13 and 2 E 14 atoms/cm$^2$, and forms P− regions 36 under N+ regions 28. The implant has the effect of reducing the junction breakdown voltage of the device from a normal range of between about 10 and 14 volts, to a lower value of between about 5 and 8 volts.

The addition of the P− regions 36 reduces the breakdown voltage because the breakdown voltage of a p-n junction is inversely proportional to the substrate impurity concentration, as explained in "Physics and Technology of Semiconductor Devices", A. S. Grove, pp. 194–195, published by John Wiley & Sons, 1967. Adding region 36 increases the substrate impurity concentration at the p-n junctions between the ESD device active regions and the substrate, and thus decreases the junction breakdown voltage.

The reduction in junction breakdown voltage improves the ESD characteristics of the device since it allows more current to be discharged through the protection device for a given amount of power. Fast power dissipation in the ESD protection device is required, in order to prevent damage to the internal devices. Given that power is defined as $$P = I * V$$

where P is power, I is the discharge current, and V is the junction breakdown voltage, it can be seen that a lower voltage will allow more current to be discharged for a given amount of power associated with an ESD charge.

Figure 7:
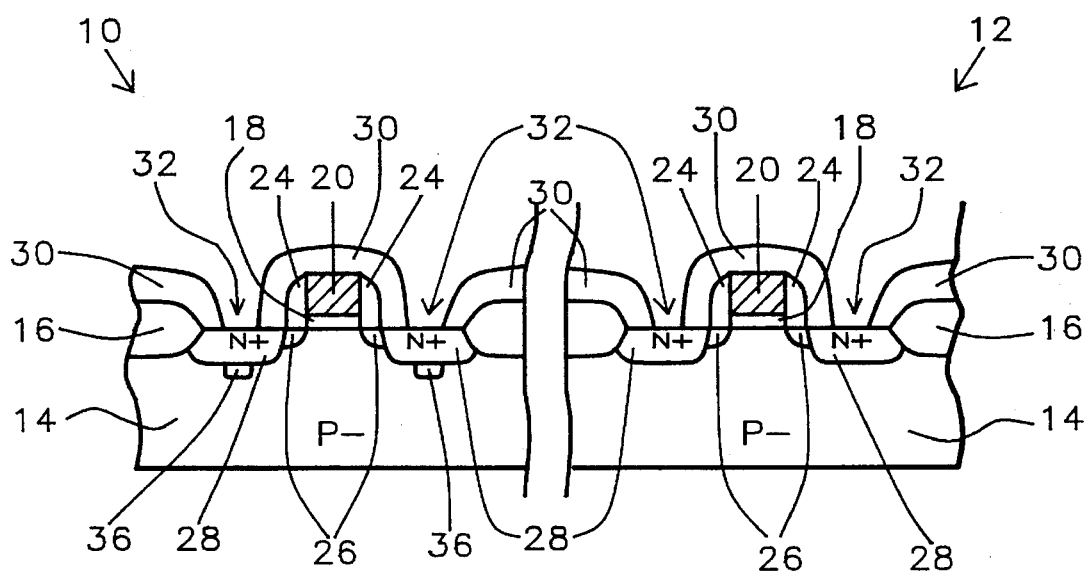

The resultant structure, after removal of resist 34, is shown in FIG. 7. Further processing then takes place to complete the circuit, by continuing with processing as is well known in the art, e.g., forming contacts to the active regions of the devices, metallization, passivation, etc. These steps are not described further as they are not important to the invention.

The invention has the following additional advantages: (1) A medium current implant can be used, instead of a high current implant; (2) product ESD adjustment cycle time is shortened and flexible; (3) there is no effect on output device performance; (4) and there is minimal capacitance increase. Regarding (1), in the conventional process a final high current implant is typically used to compensate the LDD N− dosage to improve the ESD discharge path, while in the invention a lower current implant (the implant in which P− regions 36 are created) is used. With regard to (2), because the invention allows for adjustment of the ESD characteristics after contact formation, as opposed to the extra implant step as in the conventional process, the ESD adjustment cycle time is more flexible.

Regarding output device performance, in the related art a non-LDD source/drain region is formed in the ESD device, which results in degraded device reliability due to problems with the hot-electron effect. The use of a lightly doped drain in the invention prevents this problem. And since the final ion implant of the invention effects a small area of the source/drain regions, as compared to the prior art ESD implant in which the entire source/drain region receives an implant, there is a reduced junction capacitance increase.

While the above method was described with respect to an NMOS device in which N implants were used with a P− substrate, and there was the inventive step of the final P− implant, it would be well understood by those skilled in the art that a PMOS device could similarly have been formed by using an N substrate, dopants of an opposite conductivity to form P-doped source/drain regions, and the final implant of the invention to form an N− region. This would be accomplished by a first ion implant with boron B11 at a dosage of between about 5 E 12 and 5 E 13 atoms/cm$^2$, and the second ion implant with boron B11 at a dosage of between about 1 E 15 and 6 E 15 atoms/cm$^2$. The critical final ion implant of the invention would be with phosphorus P31 at a dosage of between about 2 E 13 and 2 E 14 atoms/cm$^2$.

The invention has can also be used for CMOS devices. The NMOS device described with reference to FIGS. 1 to 7 could be combined with a similarly formed (though with dopants of opposite conductivity) PMOS device to form a CMOS structure wherein the source/drain regions of the CMOS ESD protection device would have the reduced junction breakdown voltage of the invention to improve ESD characteristics.

Figure 8:
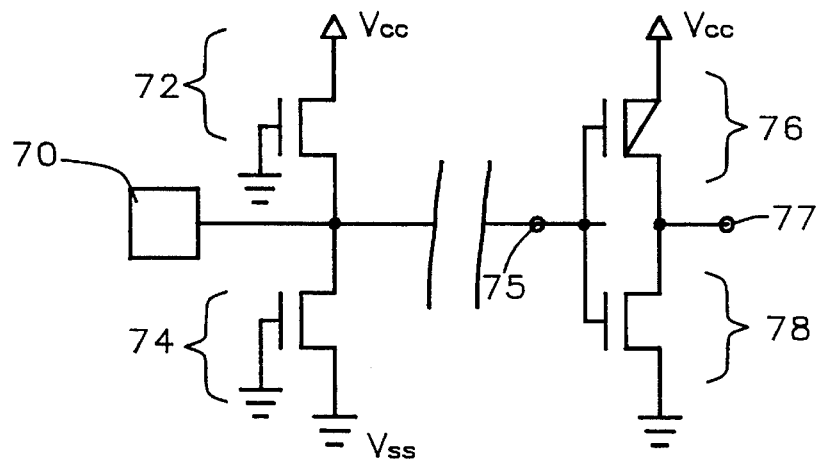
FIGS. 8 and 9 are a circuit schematic and the associated cross-sectional view, respectively, of an ESD protection device formed by the inventive method, and an associated internal CMOS device.

The invention can be more fully understood by referring to the circuit diagram of FIG. 8. An ESD protection device 40, made by the inventive method, is shown connected to input, or output, (I/O) pad 70, and consists of two NMOS devices. It is through the pad 70 that electrostatic charges may enter the integrated circuit from an exterior source such as a person handling the device. The NMOS transistor 72 has its source connected to Vcc, a voltage source. The NMOS 72 drain is connected to the drain of the NMOS transistor 74, and to the I/O pad 70, as well as to the internal circuit the ESD device is designed to protect. The NMOS transistor 74 has its gate and source connected to ground.

Figure 9:
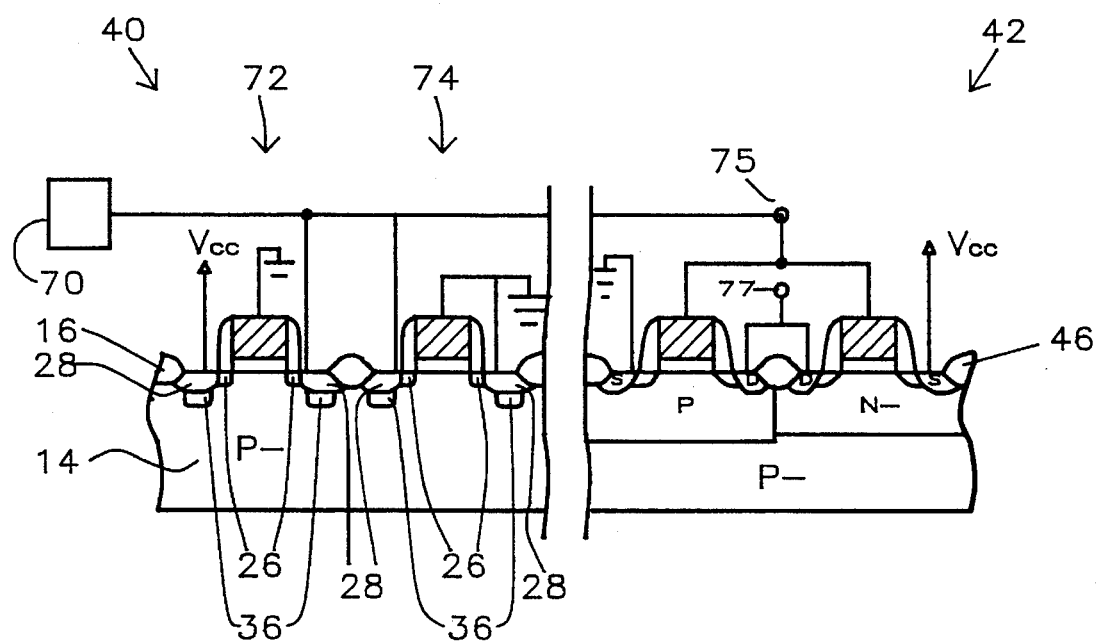

A CMOS inverter is shown as internal CMOS device 42, though other circuit structures could also be protected by the ESD protection device of the invention. This inverter has its input 75 connected to the gates of P-channel transistor 76 and N-channel transistor 78. The P-channel source is connected to Vcc, while the N-channel source is connected to ground. The drains of the two transistors are connected together and provide the output terminal of the inverter. A cross-sectional representation of the FIG. 8 circuit, and connections, is shown in FIG. 9, wherein similar elements from earlier figures are given the same numbers. The key element of the lightly doped P− regions 36 are shown, and provide the lower junction breakdown voltage and subsequent improved ESD characteristics of the invention.

While the invention has been particularly shown and described with reference to the preferred embodiments thereof, it will be understood by those skilled in the art that various changes in form and details may be made without departing from the spirit and scope of the invention.

What is claimed is:

1. An ESD protection device with reduced junction breakdown voltage, connected to an integrated circuit which includes FET devices, comprising:

a silicon substrate having a first conductivity type;

field oxide regions in and on said silicon substrate for isolation of said ESD protection device;

a gate with adjacent spacers for said ESD protection device, between said field oxide regions;

source/drain regions for said ESD protection device between said gate and said field oxide regions, with each source/drain region comprising:

a first lightly implanted region having a second conductivity type opposite to said first conductivity type, under one of said spacers;

a heavier implanted region of the same conductivity type as said first lightly implanted region, located between said first lightly implanted region and one of said field oxide regions;

a second lightly implanted region of same conductivity type as said silicon substrate, centered under said heavier implanted region.

2. The ESD protection device of claim 1 wherein said first conductivity type is P-type, and said second conductivity type is N-type.

3. The ESD protection device of claim 2 wherein said P-type conductivity caused by implanted ions of boron.

4. The ESD protection device of claim 2 wherein said N-type conductivity caused by implanted ions of phosphorus.

5. The ESD protection device of claim 1 wherein said first conductivity type is N-type, and said second conductivity type is P-type.

6. The ESD protection device of claim 5 wherein said P-type conductivity is caused by implanted ions of boron.

7. The ESD protection device of claim 6 wherein said N-type conductivity is caused by implanted ions of phosphorus.

8. An ESD protection circuit, having first and second ESD protection devices, connected to an integrated circuit which includes FET devices, and connected to an input/output pad, comprising:

a silicon substrate having a first conductivity type;

field oxide regions in and on said silicon substrate for isolation of said ESD protection devices;

gates with adjacent spacers for each of said ESD protection devices, between said field oxide regions;

source/drain regions for said ESD protection devices between said gates and said field oxide regions, with each source/drain region comprising:

a first lightly implanted region having a second conductivity type opposite to said first conductivity type, under one of said spacers;

a heavier implanted region of the same conductivity type as said first lightly implanted region, located between said first lightly implanted region and one of said field oxide regions;

a second lightly implanted region of same conductivity type as said silicon substrate, centered under said heavier implanted region;

a first electrical connection between said input/output pad, said drain regions of said first and second ESD protection devices, and said integrated circuit;

a second electrical connection to ground of said gates of said first and second ESD protection devices, and said source region of said second ESD protection device; and a third electrical connection, to a voltage source, of said source of said first ESD protection device.

\* \* \* \* \*

EX PARTE REEXAMINATION CERTIFICATE (5632nd)

United States Patent
Hsue et al.

(10) Number: US 5,559,352 C1
(45) Certificate Issued: Dec. 12, 2006

(54) ESD PROTECTION IMPROVEMENT

(75) Inventors: Chen-Chin Hsue, Hsin-chu (TW); Joe Ko, Hsinchu (TW)

(73) Assignee: United Microelectronics Corporation, Hsinchu (TW)

Reexamination Request:
No. 90/006,029, Jun. 7, 2001

Reexamination Certificate for:
Patent No.: 5,559,352
Issued: Sep. 24, 1996
Appl. No.: 08/354,373
Filed: Dec. 12, 1994

Related U.S. Application Data

(62) Division of application No. 08/139,858, filed on Oct. 22, 1993, now Pat. No. 5,374,565.

(51) Int. Cl.
*H01L 29/76* (2006.01)

(52) U.S. Cl. .................. 257/328; 257/173; 257/174; 257/344; 257/355; 257/408; 257/546

(58) Field of Classification Search ......... 257/173–174, 257/328, 344, 355, 408, 546, E29.266–E29.269, 257/E29.278–E29.279
See application file for complete search history.

(56) References Cited

U.S. PATENT DOCUMENTS

| 4,649,629 | A | 3/1987 | Miller et al. |
| 4,753,898 | A | 6/1988 | Parrillo et al. |
| 4,968,639 | A | 11/1990 | Bergonzoni |
| 5,087,582 | A | 2/1992 | Campbell et al. |
| 5,234,853 | A | 8/1993 | Ikemasu |
| 5,246,872 | A | 9/1993 | Mortensen |
| 5,272,097 | A | 12/1993 | Shiota |
| 5,374,565 | A | 12/1994 | Hsue et al. |
| 5,416,036 | A | 5/1995 | Hsue |

FOREIGN PATENT DOCUMENTS

| JP | 61082476 | 4/1986 |
| JP | 62-141778 | 6/1987 |
| JP | 64-23573 | 1/1989 |
| JP | 1134961 | 5/1989 |
| JP | 3-196677 | 8/1991 |
| JP | 5-102475 | 4/1993 |

*Primary Examiner*—Erik Kielin

(57) ABSTRACT

A method of forming an ESD protection device with reduced breakdown voltage, simultaneously with an integrated circuit which includes FET devices, and the resultant device structure, are described. A silicon substrate is provided on which there are field oxide regions, gates, and active regions. A first ion implant of a conductivity-imparting dopant is performed in a vertical direction into the active regions of the ESD protection device and the FET devices. A first insulating layer is formed over the ESD protection device and the FET devices, and over the field oxide regions. The first insulating layer is patterned to create spacers adjacent to the gates of both the ESD protection device and the FET devices. A second ion implant of a conductivity-imparting dopant with higher concentration than dopant from the first ion implant is performed into active regions of both the ESD protection device and the FET devices. A second insulating layer is formed over the ESD protection device and the FET devices, and over the field oxide regions. The second insulating layer is patterned to form contact openings to the active regions. Finally, a third ion implant of a conductivity-imparting dopant, with opposite conductivity from the first and second ion implants, having equal concentration to dopant from the first ion implant, is performed through the contact openings into active regions of the ESD protection device.

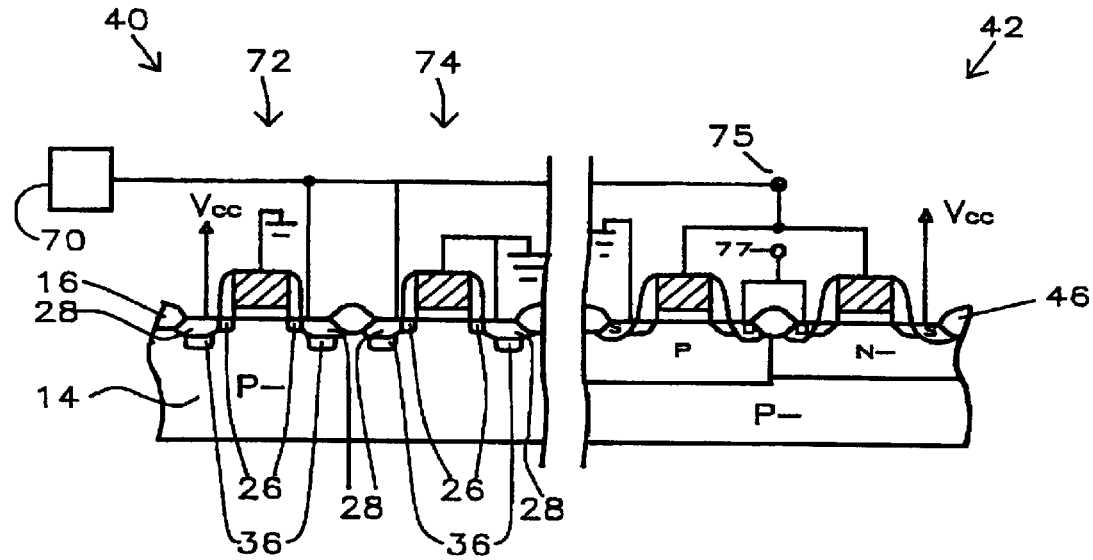

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claim 8 is confirmed.

Claim 1 is determined to be patentable as amended.

Claims 2–7, dependent on an amended claim, are determined to be patentable.

New claims 9–24 are added and determined to be patentable.

1. An ESD protection device with reduced junction breakdown voltage, connected to [an] *a separate* integrated circuit which includes *an internal circuit having* FET devices, *the ESD protection device* comprising:
   a silicon substrate having a first conductivity type;
   field oxide regions in and on said silicon substrate for isolation of said ESD protection device;
   a gate with adjacent spacers for said ESD protection device, between said field oxide regions;
   source/drain regions for said ESD protection device between said gate and said field oxide regions, with each source/drain region comprising:
      a first lightly implanted region having a second conductivity type opposite to said first conductivity type, under one of said spacers;
      a heavier implanted region of the same conductivity type as said first lightly implanted region, located between said first lightly implanted region and one of said field oxide regions;
      a second lightly implanted region of same conductivity type as said silicon substrate, centered under said heavier implanted region;
   *wherein said ESD protection device protects said separate integrated circuit which includes said internal circuit from electrostatic discharge damage.*

*9. An electrostatic discharge (ESD) protection device for protecting an internal circuit of an integrated circuit (IC) comprising:*
      *a silicon substrate having a first conductivity type;*
      *field oxide regions in and on said silicon substrate for isolation of said ESD protection device and internal circuits;*
      *gates with adjacent spacers for said ESD protection device and said internal circuit, between said field oxide regions;*
      *source/drain regions for said ESD protection device and said internal circuit, between said gates and said field oxide regions and comprising:*
         *first lightly implanted regions of a second conductivity type under said spacers, said first lightly implanted regions being formed by a first ion implantation of a first dosage which is opposite to said first conductivity type;*
         *heavier implanted regions of the second conductivity type located between said first lightly implanted regions and said field oxide regions, said heavier implanted regions being formed by said first ion implantation and a second heavier dosage ion implantation, said second heavier dosage ion implantation having a dosage at least 10 times greater than said first ion implantation;*
      *said ESD protection device further including a plurality of second lightly implanted regions of the first conductivity type centered under a corresponding plurality of said heavier implanted regions, which plurality of second lightly implanted regions are coupled to an input/output pad, reducing a PN junction breakdown voltage of said ESD protection device;*
      *wherein source/drain regions of said internal circuit do not include said second lightly implanted region.*

*10. The ESD protection device of claim 9 wherein said first conductivity is P type, and said second heavier dosage ion implantation consists of a dosage of N type atoms that are not used in said first ion implantation for the first lightly implanted regions.*

*11. The ESD protection device of claim 10 wherein said internal circuit is a CMOS circuit.*

*12. The ESD protection device of claim 10 wherein said first ion implantation for the first lightly implanted regions uses phosphorus, and said second heavier ion implantation uses arsenic.*

*13. An ESD protection device for protecting an internal circuit of a complementary metal oxide semiconductor (CMOS) integrated cirucit (IC) comprising:*
      *a P type silicon substrate having a first conductivity type;*
      *field oxide regions in and on said silicon substrate for isolation of said ESD protection device and internal circuits;*
      *gates with adjacent spacers for said ESD protection device and said internal circuit, between said field oxide regions;*
      *source/drain regions for said ESD protection device and said internal circuit, between said gate and said field oxide regions and comprising:*
         *first lightly implanted N type regions under said spacers, said first lightly implanted N type regions being comprised of a first N type atom;*
         *heavier implanted N type regions located between said first lightly implanted N type regions and said field oxide regions, said heavier implanted regions being comprised of said first N type atom and a second N type atom that is different from said first N type atom;*
      *said ESD protection device further including a plurality of second lightly implanted P type regions centered under a corresponding plurality of said heavier implanted N type regions, which plurality of second lightly implanted P type regions are coupled to an input/output pad, reducing a PN junction breakdown voltage of said ESD protection device;*
      *wherein source/drain regions of said internal circuit do not include said second lightly implanted P type region.*

*14. The ESD protection device of claim 13 wherein said first lightly implanted N type regions are formed using a dosage of N type atoms between about 1E 13 and 1E 14 atoms/cm$^2$.*

15. The ESD protection device of claim 13 wherein said heavier implanted N type regions are formed using a dosage of N type atoms between about 1E 15 and 6E 15 atoms/cm$^2$.

16. The ESD protection device of claim 13 wherein said first N type atoms are phosphorus and said second N type atoms are arsenic.

17. The ESD protection device of claim 13 wherein said plurality of second lightly implanted P type regions are located under contacts formed on said source/drain regions.

18. An electrostatic discharge (ESD) protection device with reduced junction breakdown voltage, connected to and adapted to protect an integrated circuit which includes FET devices, comprising:

a silicon substrate having a first conductivity type;

field oxide region in and on said silicon substrate for isolation of said ESD protection device;

a gate with adjacent spacers for said ESD protection device, between said field oxide regions;

ESD protection source/drain regions for said ESD protection device between said gate and said field oxide regions, with each ESD protection source/drain region comprising:

a first lightly implanted region having a second conductivity type opposite to said first conductivity type, under one of said spacers;

a heavier implanted region of the same conductivity type as said first lightly implanted region, located between said first lightly implanted region and one of said field oxide regions;

a second lightly implanted region of same conductivity type as said silicon substrate, centered under said heavier implanted region;

wherein said ESD protection source/drain regions are connected through metal contacts to an input/output (I/O) pad to discharge current from electrostatic discharges entering the integrated circuit.

19. The ESD protection device of claim 18 wherein said second lightly implanted regions of said ESD protection device are situated under contact regions for said metal contacts.

20. The ESD protection device of claim 18, wherein said ESD protection device provides a first current path to a first voltage potential, and a second current path to a second voltage potential.

21. The ESD protection device of claim 20, wherein said first voltage potential is a voltage source and said second voltage potential is ground.

22. The ESD protection device of claim 18, wherein said second lightly implanted region is effected in only a small area of said ESD protection source/drain regions.

23. The ESD protection device of claim 18, wherein said second lightly implanted region causes said gate to have a source/drain junction breakdown that is about ½ that of the FET devices of an internal circuit of the integrated circuit.

24. The ESD protection device of claim 18, further including a P type MOS gate which includes at least one source/drain region with a reduced breakdown voltage coupled to the I/O pad.

\* \* \* \* \*